(12) United States Patent
Johnson et al.

(10) Patent No.: US 7,265,699 B1
(45) Date of Patent: Sep. 4, 2007

(54) NINE-POSITION RESISTOR LADDER SWITCH ASSEMBLY

(75) Inventors: Wade G. Johnson, Oxford, MI (US); Matthew A. Darin, Lake Orion, MI (US); Brian J. Ciesinski, Commerce Township, MI (US)

(73) Assignee: GM Global Technology Operations, Inc., Detroit, MI (US)

( * ) Notice: Subject to any disclaimer, the term of this patent is extended or adjusted under 35 U.S.C. 154(b) by 0 days.

(21) Appl. No.: 11/363,659

(22) Filed: Feb. 28, 2006

(51) Int. Cl.
*H03M 1/78* (2006.01)
(52) U.S. Cl. .................... 341/154; 341/155
(58) Field of Classification Search ........ 341/126–170; 705/1; 340/870; 280/735, 307
See application file for complete search history.

(56) References Cited

U.S. PATENT DOCUMENTS

| | | | |
|---|---|---|---|
| 5,952,952 A * | 9/1999 | Choi et al. .................. 341/172 |
| 6,695,837 B2 * | 2/2004 | Howell ........................ 606/29 |
| 6,762,693 B2 * | 7/2004 | Wand .................... 340/870.13 |
| 6,956,952 B1 * | 10/2005 | Riggs .......................... 381/86 |
| 7,020,289 B1 * | 3/2006 | Riggs .......................... 381/86 |
| 7,064,682 B2 * | 6/2006 | Fedigan ...................... 341/29 |

* cited by examiner

*Primary Examiner*—Lam T. Mai

(57) ABSTRACT

A switch assembly is provided for use on a vehicle having a source of supply voltage. The assembly comprises a switching network having an input terminal configured to be coupled to the supply voltage and an output terminal. The network comprises: (1) nine series-coupled resistors coupled between the input terminal and the output terminal, each resistor having a substantially predetermined resistance; and (2) nine switches each coupled between the input terminal and the output terminal and capable of being opened and closed by an operator of the vehicle. Eight of the switches are each coupled to a different junction of adjacent resistors, and the ninth switch is coupled between the output terminal and the ninth resistor. The switch assembly further comprises a control module coupled to the output terminal for determining which, if any, of the nine switches is closed.

20 Claims, 2 Drawing Sheets

NINE-POSITION RESISTOR LADDER SWITCH ASSEMBLY

TECHNICAL FIELD

The present invention relates generally to resistor ladder networks and, more specifically, to a nine-position resistor ladder circuit for use in a vehicular switch assembly.

BACKGROUND OF THE INVENTION

As vehicles have developed over the years, the number of vehicular features and the ways in which those features may be adjusted (e.g., the number of feature modes) have increased dramatically. It is now common to provide a group of buttons or switches that a user (e.g., a driver) may utilize to adjust a vehicle's features to a preferential mode, and it is known to use resistor ladder networks in conjunction with these switches. Resistor ladder networks typically comprise a plurality of resistors and a plurality of switches disposed such that the closing of any one of the switches alters either the high resistance or the low resistance of a voltage divider circuit. The voltage divider circuit is comprised of a high resistance between a source of supply voltage and an output terminal and a low resistance between the output terminal and a low voltage reference, often referred to as ground. The resistor ladder is substituted for either the high resistance or low resistance in the voltage divider network. In this way, the resistance of the network is made variable and will exhibit a unique resistance range depending upon which switch is activated or depressed. Thus, the output voltage of the voltage divider is indicative of which, if any, of the switches are closed (i.e., user switch selection).

Certain vehicles have been designed that include clusters of control switches on and/or around the steering wheel of the vehicle for easy access by the driver. In fact, it has been found that a desirable switch assembly for this purpose includes nine such switches. Such switch assemblies may be configured to control, for example, an onboard telephone system or the vehicle's entertainment equipment. For example, with respect to the vehicle's radio, these switches may control power, volume, and tuning. In the case of a CD player, certain switches may be utilized for disk and/or track selection.

For automotive applications, an onboard processor must be able to distinguish between various voltages each corresponding to the activation of a specific switch or combination of switches. For this and other reasons, resistor ladder switch assemblies have been limited in the number of switches that they may employ. The problem is complicated due to supply voltage (e.g., battery) variations. That is, the battery voltage in a twelve volt automotive electrical system may, in fact, vary or drift between approximately nine volts and sixteen volts. Additionally, other operational conditions experienced in the vehicular environment may cause fluctuations in the battery voltage and the voltages appearing at the output of the ladder networks, including extreme temperature variations (e.g., −40 to 80 degrees Celsius), vibrations, and corrosive agents. Considering this, the output voltages associated with each switch state must be sufficiently separated from those associated with the other states to compensate for such fluctuations.

For the reasons described above, conventional switch assemblies having nine switches typically include a four-resistor ladder network and a five-resistor ladder network, although nine-position switch assemblies are known that are comprised of other combinations of ladder networks (e.g., a three-resistor ladder network and a six-resistor ladder network, three three-resistor ladder networks, etc.). In assemblies combining four- and five-resistor ladder networks, the output voltage of the four-resistor network is indicative of which, if any, of the four associated switches has been activated. Likewise, the output of the five-resistor network is indicative of which, if any, of the five associated switches has been activated. The output of the two ladder networks are provided to first and second input terminals of an onboard processor that monitors the two voltages and determines which, if any, of the nine switches have been activated by the driver. The need to utilize separate four-resistor and five-resistor ladder networks providing first and second output voltages, respectively, results in a more complex, costly, and cumbersome system.

Considering the above, it should be appreciated that it would be desirable to provide a resistor ladder switch assembly for use on a vehicle that includes a nine-position resistor ladder network having a single output voltage for discriminating amongst the nine switches. Furthermore, other desirable features and functions of the present invention will become apparent from the subsequent detailed description of the invention and the appended claims, taken in conjunction with the accompanying drawings and this background of the invention.

SUMMARY OF THE INVENTION

A switch assembly is provided for use on a vehicle having a source of supply voltage. The assembly comprises a switching network having an input terminal configured to be coupled to the supply voltage and an output terminal. The network comprises: (1) nine series-coupled resistors coupled between the input terminal and the output terminal, each resistor having a substantially predetermined resistance; and (2) nine switches each coupled between the input terminal and the output terminal and capable of being opened and closed by an operator of the vehicle. Eight of the switches are each coupled to a different junction of adjacent resistors, and the ninth switch is coupled between the output terminal and the ninth resistor. The switch assembly further comprises a control module coupled to the output terminal for determining which, if any, of the nine switches is closed.

DESCRIPTION OF THE DRAWINGS

The present invention will hereinafter be described in conjunction with the following figures, wherein like reference numerals denote like elements, and.

DETAILED DESCRIPTION OF THE INVENTION

The following detailed description of the invention is merely exemplary in nature and is not intended to limit the scope, applicability, or configuration of the invention in any way. Rather, the following description provides a convenient illustration for implementing exemplary embodiments of the invention. Various changes to the described embodiments may be made in the function and arrangement of the elements described herein without departing from the scope of the invention.

Figure 1:
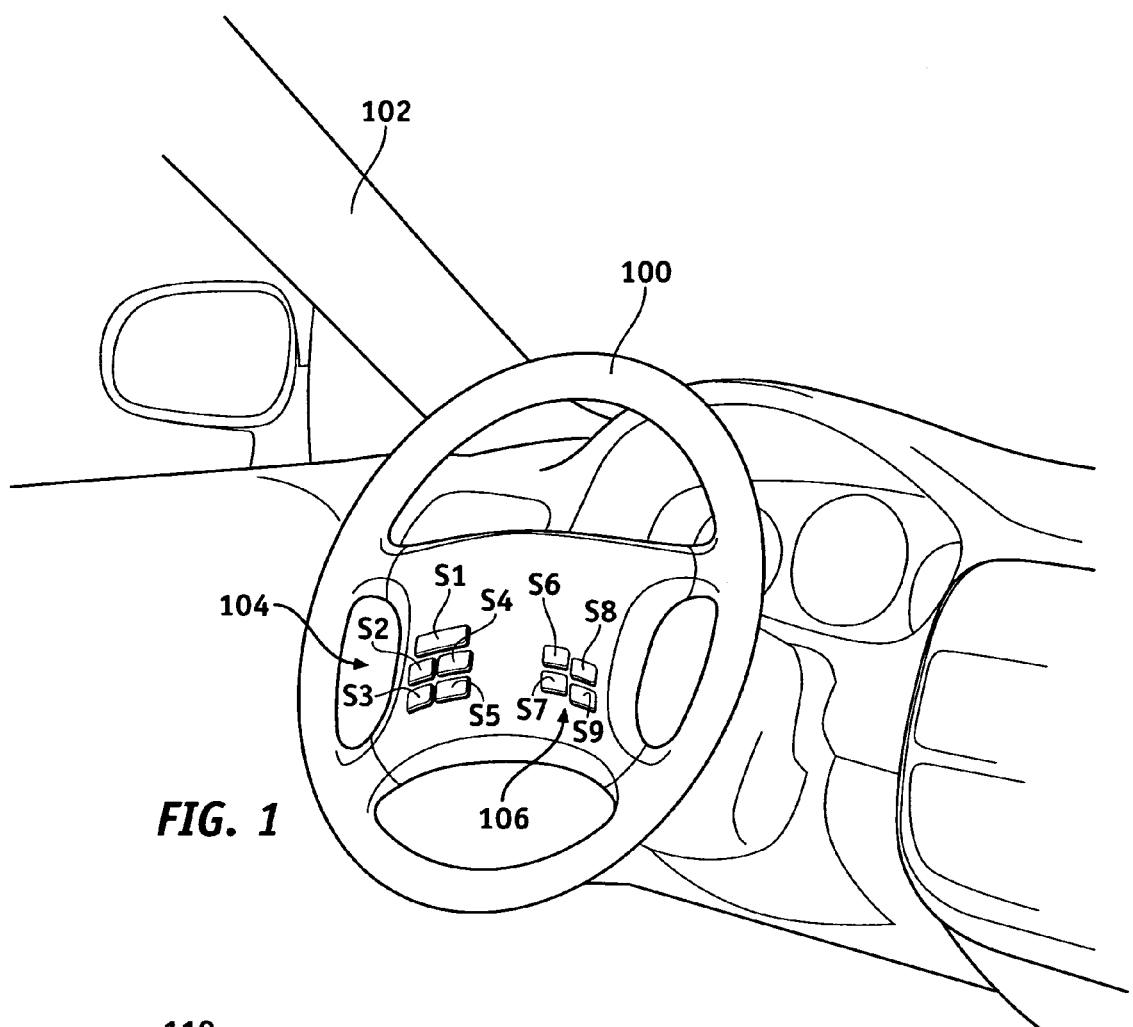
FIG. 1 is an isometric view of a steering wheel having a nine-switch user interface.

FIG. 1 is an isometric view of a steering wheel assembly 100 deployed on a vehicle 102. A user interface comprising nine switches S1-S9 is deployed on a portion of steering wheel assembly 100. Switches S1-S9 may be separated into various switch clusters, and each switch cluster may control a different vehicular feature or different aspects of the same vehicular feature. As shown in FIG. 1, for example, switches S1-S5 may be employed in a left hand switch cluster 104 and configured to control the vehicle's audio system, while switches S6-S9 may be employed in a right hand switch cluster 106 and configured to control an onboard telephone system. As will be explained more fully below in conjunction with FIGS. 2 and 3, switches S1-S9 may be monitored by a suitable onboard processor (e.g., a processor associated with the vehicle's body control module, radio, instrument control panel, etc.) to determine if a user (e.g., a driver of vehicle 102) has depressed or activated any of the switches in cluster 104 or in cluster 106.

Figure 2:
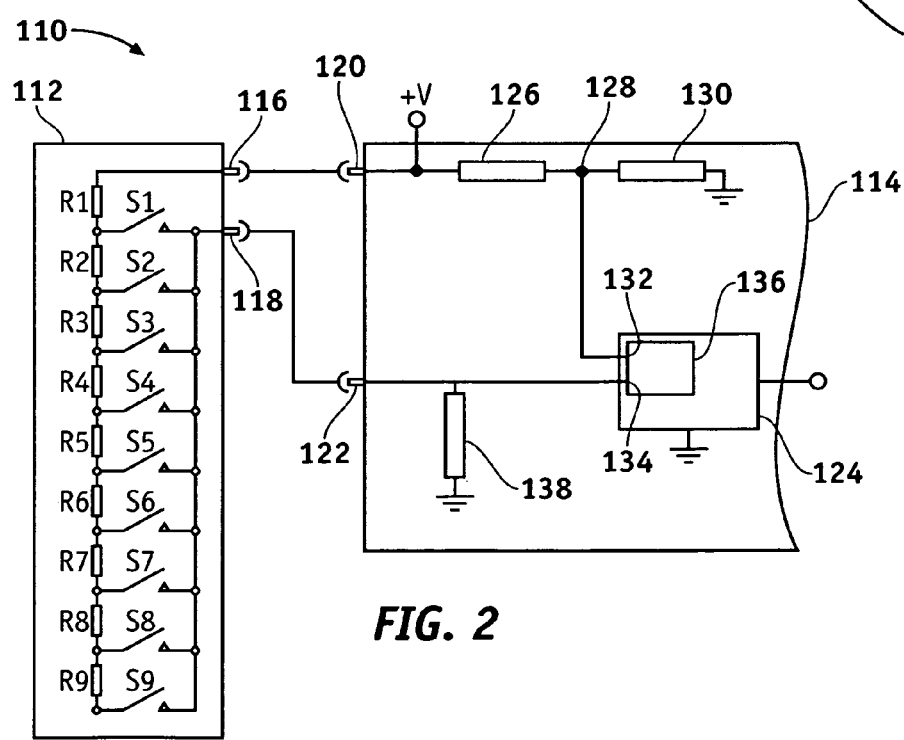
FIG. 2 is a schematic diagram of a nine-position resistor ladder switch assembly suitable for use in conjunction with the steering wheel control interface shown in FIG. 1 in accordance with an exemplary embodiment of the present invention.

FIG. 2 is a schematic diagram of a switch assembly 110 comprising a control module 114 (e.g., the vehicle's body control module, radio module, instrument control panel module, etc.) and a nine-position resistor ladder network 112 having a first input terminal 116 and a first output terminal 118. As can be seen in FIG. 2, nine resistors R1-R9 and nine switches S1-S9, which correspond to switches S1-S9 of steering wheel assembly 100 (FIG. 1), are disposed within network 112 between terminal 116 and terminal 118. More specifically, switches S1-S9 are disposed in parallel between input terminal 116 and output terminal 118, and each of switches S1-S8 is coupled between output terminal 118 and a different junction of adjacent pairs of resistors. That is, switch S1 is coupled to the junction of resistors R1 and R2, switch S2 is coupled to the junction of resistors R2 and R3, switch S3 is coupled to the junction of resistors R3 and R4, and so on through switch S8. Switch S9 is coupled between terminal 118 and a terminal of resistor R9.

As is shown in FIG. 2, terminal 116 of network 112 may be coupled to a supply voltage (+V), which may simply comprise the battery of a conventional twelve volt automotive electrical system. It should be appreciated from the configuration of network 112 that, when any given switch S1-S9 is closed, the resistance coupled between input terminal 116 and output terminal 118 will be the sum of the resistances of the series-coupled resistors between the closed switch and input terminal 116. For example, if switch S7 is closed, the resistance applied between terminal 116 and terminal 118 will be the sum of the resistances of resistors R1-R7. Thus, as each switch selection corresponds to a series of resistors each having a unique and substantially predetermined resistance, and as each switch selection will therefore correspond to a unique and substantially predetermined total resistance, the voltage appearing at output terminal 118 will be indicative of which of the switches S1-S9 is currently closed. It should further be appreciated from the configuration of network 112 that, when more than one of switches S1-S9 is closed, the resistance applied between terminal 116 and terminal 118 will be substantially equal to that applied when only the lowest numbered switch in the combination is closed. For example, when switches S3-S5 are closed (or, for that matter, when switch S3 and any combination of switches S4-S9 are closed), the voltage appearing at output terminal 118 will be substantially equivalent to that appearing at terminal 118 when only switch S3 is closed.

So that control module 114 may interpret the voltage appearing at terminal 118, terminal 118 is coupled to an input 122 of control module 114 comprising a processor 124 that may include a multi-channel analog-to-digital converter 136. In particular, output terminal 118 of resistor ladder network 112 may be coupled to an input 122 of control module 114. Input 122 may be coupled to a pull-down resistor 138, which is, in turn, coupled to a first input 134 of analog-to-digital converter 136 of processor 124. Analog-to-digital converter 136 generates a digital representation of the voltage appearing at output terminal 118. Additionally, the supply voltage (+V) may be applied to a voltage level-shifting circuit or resistive voltage divider that includes a first resistor 126, a second resistor 130, and an intermediate node 128 as shown in FIG. 2. This level-shifts the supply voltage at node 128 to a voltage suitable for processing by analog-to-digital converter 136. Converter 136 receives the divided-down voltage at input 132 and converts it to a digital signal suitable for processor 124. Processor 124 utilizes the digital representations of the voltage appearing at output terminal 118 and the supply voltage provided by converter 136 to determine a voltage compensation ratio indicative of user switch selection as described below in connection with FIG. 3.

After determining the total resistance across network 112 by comparing the voltage appearing at output terminal 118 to the supply voltage (+V), processor 124 determines a voltage compensation ratio indicative of user switch selection. Processor 124 determines the voltage compensation ratio by taking the ratio of the voltage appearing at input terminal 122 to the voltage appearing at node 128. As will be more fully discussed below in conjunction with FIG. 3, each of resistors R1-R9 are chosen to have a resistance such that each switch closure combination yields a voltage ratio that falls within a unique voltage ratio range. The particular resistance chosen for each resistor may vary; however, it is preferable to choose resistors that are commonly produced and readily available to minimize production costs. In a preferred embodiment, resistors R1-R9 are chosen to have the following approximate resistances: resistor R1 is chosen to have a resistance of substantially 1050 ohms, resistor R2 to have a resistance of substantially 274 ohms, resistor R3 to have a resistance of substantially 348 ohms, resistor R4 to have a resistance of substantially 464 ohms, resistor R5 to have a resistance of substantially 634 ohms, resistor R6 to have a resistance of substantially 887 ohms, resistor R7 to have a resistance of substantially 1330 ohms, resistor R8 to have a resistance of substantially 2210 ohms, and resistor R9 to have a resistance of substantially 4320 ohms. Lastly, resistor 138 may be chosen to have a resistance of substantially 392 ohms. It should be clear, however, that these resistance values are examples only, and it will be appreciated by one skilled in the art that other values may be suitable to produce discrete voltages at the output of the nine-position ladder network indicative of user switch selection. Additionally, it should be understood these values need not be assigned to any particular resistor within the ladder network; e.g., with respect to the preferred embodiment described above, resistor R8 may be chosen to have a resistance of substantially 4320 ohms, while resistor R9 is chosen to have a resistances of substantially 2210 ohms.

Figure 3:
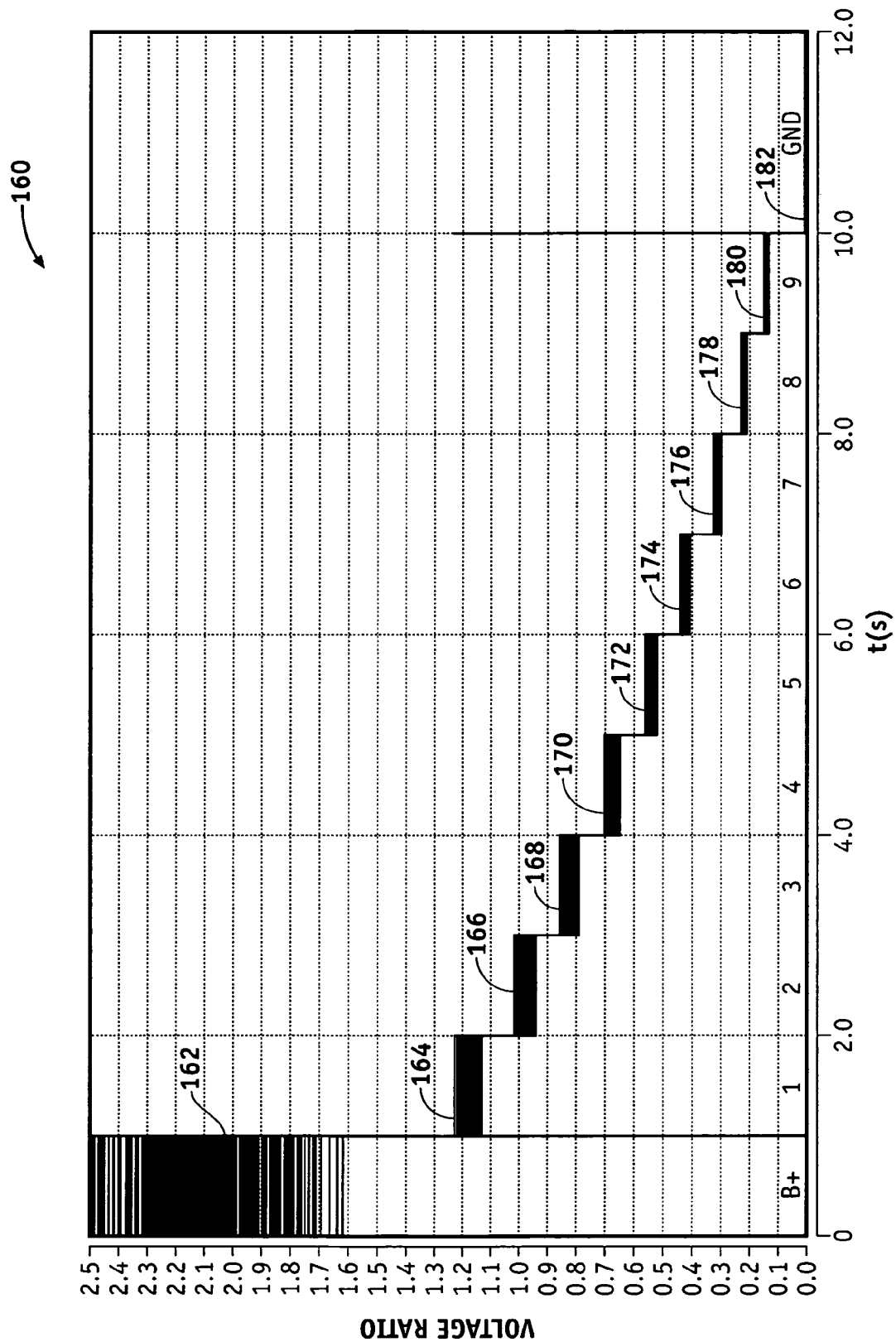
FIG. 3 is a graph that shows the relationship between a voltage ratio (y-axis) and time (x-axis) illustrating the ratio when the assembly of FIG. 2 is shorted to ground, when each of the nine switches is closed, and when the assembly is shorted to the supply voltage.

FIG. 3 is a graph 160 that shows the relationship between the voltage compensation ratio (y-axis) and time (x-axis)

illustrating the ratio during eleven different states; i.e., when the assembly is shorted to the supply voltage (failure state 162), when each of the nine switches is closed (switch-specific states 164, 166, 168, 170, 172, 174, 176, 178, and 180), and when terminal 118 is shorted to ground (state 182). The states are shown in FIG. 3 as being performed sequentially over a twelve second time period wherein failure state 162 is performed first (i.e., from 0-1 second) and shorted state 182 is performed last (i.e., from 10-12 seconds) to improve clarity. Switch-specific states 164, 166, 168, 170, 172, 174, 176, 178, and 180 each represent a range of voltage ratios that indicate the closure of a particular switch. In particular, a ratio in the range of state 164 indicates that switch S1 is closed, a ratio in the range associated with state 166 indicates that switch S2 is closed, a ratio in the range associated with state 168 indicates that switch S3 is closed, etc. Finally, a ratio within the range associated with failure state 162 indicates that terminal 118 has been shorted to battery, and a ratio within the range associated with state 182 (i.e., a ratio of substantially zero) indicates that terminal 118 has been shorted to ground. It may be desirable to configure processor 124 such that, when determining that a voltage compensation ratio is within the range associated with failure state 162 or that associated with state 182, processor 124 enters a failure mode (e.g., a time-out period during which process 124 will not accept user input). If desired, an alert (e.g., a visual alert, an audible alert, etc.) may also be generated when processor 124 enters the failure mode.

Referring now to FIGS. 1-3 collectively, processor 124 determines which, if any, of switches S1-S9 have been activated by a user of vehicle 102 via steering wheel interface 100 in the following manner. Assume first that switch S5 is assigned a STEREO VOLUME DOWN function, and that a user of vehicle 102 depresses switch S5. Processor 124 receives a digital signal representing the supply voltage and the voltage appearing at output 118 of network 112 and determines therefrom the total resistance across network 112. To determine the voltage compensation ratio, processor 124 then takes the ratio of the voltage appearing at input terminal 122 to the voltage appearing at node 128. In accordance with this example, processor 124 may determine the voltage compensation ratio to be approximately 0.55. Next, processor 124 establishes by means of, for example, a reference (e.g., graph 160, a look-up table, etc.) a state-specific range in which the ratio falls. Here, processor 124 determines that the voltage ratio falls within the range associated with state 172 (see graph 160 in FIG. 3) and, consequently, that switch S5 has been closed. To complete the example, processor 124 may then cause the volume of the vehicle's stereo system to decrease.

It may be desirable to employ a software filter in conjunction with the nine-position resistor ladder network, though by no means necessary. As is well-known in the industry, software filters decrease the likelihood of false activation of vehicle functions due to electrical noise that may be prevalent in the vehicular environment. This is typically accomplished by repeatedly sampling the voltage compensation ratio to ensure that the ratio remains substantially the same for a predetermined period of time (e.g., 30 to 50 milliseconds) before establishing that a particular switch has in fact been activated by a user.

It should thus be appreciated from the foregoing that there has been provided a resistor ladder switch assembly for use on a vehicle that includes a nine-position resistor ladder network having a single output voltage for discriminating between the nine switches. It should be understood that, although discussed above as being situated on a vehicle's steering wheel, the inventive switch assembly may be deployed in a variety of locations in the automotive environment (e.g., the door panel, the center stack, etc.). It should further be understood that, although in the exemplary system above all analog-to-digital conversions were performed by converter 136 of processor 124 (FIG. 2), some or all of the analog-to-digital conversions may be performed by other suitable means (e.g., one or more analog-to-digital converters independent of processor 124). Lastly, it should also be understood that the term "resistor" is used herein in its broadest sense and encompasses resistive networks or circuits comprising multiple resistors.

While a limited number of exemplary embodiments have been presented in the foregoing detailed description, it should be appreciated that a vast number of variations exist. It should also be appreciated that the exemplary embodiments are only examples, and are not intended to limit the scope, applicability, or configuration of the invention in any way. Rather, the foregoing detailed description will provide those skilled in the art with a convenient road map for implementing the exemplary embodiments. Various changes can be made in the function and arrangement of elements without departing from the scope of the invention as set forth in the appended claims and the legal equivalents thereof.

What is claimed is:

1. A switch assembly for use on a vehicle having a source of supply voltage, comprising:
   a switching network having an input terminal configured to be coupled to the supply voltage and having an output terminal, said network comprising:
   nine series-coupled resistors coupled between said input terminal and said output terminal, each resistor having a substantially predetermined resistance; and
   nine switches each coupled between said input terminal and said output terminal and configured to be moved by an operator of the vehicle between an open position and a closed position, eight of said switches each coupled to a different junction of adjacent resistors, and said ninth switch coupled between said output terminal and said ninth resistor; and
   a control module coupled to said output terminal for determining which, if any, of said nine switches is closed.

2. A switch assembly according to claim 1 wherein said control module is configured to compare the supply voltage to the voltage at said output terminal to determine a total resistance indicative of which, if any, of said nine switches is closed.

3. A switch assembly according to claim 2 wherein said control module comprises:
   a processor; and
   an analog-to-digital converter having at least first and second channels, said first channel configured to be coupled to the supply voltage and having a first output coupled to said processor for supplying said processor with a digital representation of the supply voltage, and said second channel configured to be coupled to said output terminal and having a second output coupled to said processor for supplying to said processor a digital representation of the voltage at said output terminal.

4. A switch assembly according to claim 1 wherein said supply voltage is derived from the battery of the vehicle.

5. A switch assembly according to claim 3 wherein said control module further comprises a voltage level-shifting circuit coupled between the supply voltage and said first channel.

6. A switch assembly according to claim 1 wherein the vehicle includes a steering wheel assembly and at least one of said nine switches is mounted proximate the steering wheel assembly.

7. A switch assembly according to claim 6 wherein at least a first two of said nine switches are mounted on the steering wheel assembly in a first switch cluster, and at least a second two of said nine switches are mounted on the steering wheel assembly in a second switch cluster.

8. A switch assembly according to claim 2 wherein said switch assembly further comprises a tenth resistor coupled to said control module, and wherein said control module is configured determine the ratio of said total resistance to that of said tenth resistor to determine user switch selection.

9. A switch assembly according to claim 8 wherein said nine resistors comprise a first resistor having a resistance of substantially 1050 ohms, a second resistor having a resistance of substantially 274 ohms, a third resistor having a resistance of substantially 348 ohms, a fourth resistor having a resistance of substantially 464 ohms, a fifth resistor having a resistance of substantially 634 ohms, a sixth resistor having a resistance of substantially 887 ohms, a seventh resistor having a resistance of substantially 1330 ohms, an eighth resistor having a resistance of substantially 2210 ohms, and a ninth resistor having a resistance of substantially 4320 ohms.

10. A switch assembly according to claim 9 wherein said tenth resistor has a resistance of substantially 392 ohms.

11. A vehicular switch assembly configured for access by a driver of a vehicle, the assembly comprising:
  a pull-down resistor;
  a switching network having an input terminal configured to be coupled to a source of supply voltage and having an output terminal, said network comprising:
    nine driver-accessible switches coupled between said input terminal and said output terminal, each switch configured to be selectively activated;
    nine resistors coupled in series between said input terminal and said output terminal and disposed so as to form a resistor ladder network with said nine switches, each of said nine resistors being chosen such that the ratio of the total resistance across said switching network to the resistance of said pull-down resistor is substantially within one of a plurality of unique and predetermined ratio ranges corresponding to the activation of each of said nine switches; and
  a control module coupled to said output terminal and to said pull-down resistor for comparing said ratio to said plurality of ratio ranges to determine which, if any, of said nine switches is activated.

12. A vehicular switch assembly according to claim 11 wherein said nine resistors are each chosen such that each ratio range in said plurality of ratio ranges is substantially offset from the other ratio ranges in said plurality of ratio ranges.

13. A vehicular switch assembly according to claim 11 wherein said plurality of ratio ranges includes a tenth unique ratio range associated with a failure mode.

14. A vehicular switch assembly according to claim 11 wherein said control module comprises:
  a processor;
  an analog-to-digital converter having at least first and second channels, said first channel configured to be coupled to the supply voltage and having a first output coupled to said processor for supplying said processor with a digital representation of the supply voltage, and said second channel configured to be coupled to said output terminal and having a second output coupled to said processor for supplying to said processor a digital representation of the voltage at said output terminal; and
  a voltage level-shifting circuit coupled between the supply voltage and said first channel.

15. A nine-position switch assembly for use on a vehicle that includes a first source of supply voltage, comprising:
  a nine-position resistor ladder network including an output and an input configured to be coupled to the first source of supply voltage, said network comprising:
    nine switches coupled in parallel between said input and said output, each of said nine switches configured to be moved by an operator of the vehicle between an open position and a closed position; and
    nine resistive circuits coupled in series between said input and said output, each of said nine resistive circuits having a predetermined and unique resistance;
  a tenth resistive circuit; and
  a control module coupled to said output terminal and to said tenth resistive circuit for storing a plurality of predetermined ratio ranges each corresponding to the closure of a different one of said nine switches, said control module configured to (1) establish a voltage compensation ratio by comparing the resistance across said input terminal and said output terminal to that of said tenth resistive circuit, and (2) compare the established voltage compensation ratio to said plurality of predetermined ratio ranges to determine which, if any, of nine switches are closed.

16. A nine-position switch assembly according to claim 15 wherein each of said resistive circuits comprises a single resistor.

17. A nine-position switch assembly according to claim 15 wherein said control module is a body control module.

18. A vehicular switch assembly according to claim 15 wherein said control module comprises:
  a processor;
  an analog-to-digital converter having at least first and second channels, said first channel configured to be coupled to the first source of supply voltage and having a first output coupled to said processor for supplying said processor with a digital representation of the supply voltage, and said second channel configured to be coupled to said output terminal and having a second output coupled to said processor for supplying to said processor a digital representation of the voltage at said output terminal; and
  a voltage level-shifting circuit coupled between the first source of supply voltage and said first channel.

19. A vehicular switch assembly according to claim 18 wherein the vehicle includes a second source of supply voltage, and wherein said tenth resistive circuit comprises a resistor configured to be coupled between said processor and the second source of supply voltage, said processor configured to utilize said second source of supply voltage as a reference voltage.

20. A switch assembly according to claim 15 wherein said plurality of ratio ranges includes a tenth unique ratio range, and wherein said control module is configured to enter into a failure mode when said ratio is within said tenth ratio range.

* * * * *